(12) United States Patent
Son et al.

(10) Patent No.: US 11,322,564 B2
(45) Date of Patent: May 3, 2022

(54) DISPLAY DEVICE

(71) Applicant: LG Display Co., Ltd., Seoul (KR)

(72) Inventors: Seok-Woo Son, Jeollanam-do (KR); Jeong-Gi Yun, Gimpo-si (KR); Jong-Han Park, Seoul (KR); Jo-Yeon Kim, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/661,977

(22) Filed: Oct. 23, 2019

(65) Prior Publication Data

US 2020/0168683 A1    May 28, 2020

(30) Foreign Application Priority Data

Nov. 22, 2018  (KR) .................. 10-2018-0145431

(51) Int. Cl.
| | | |
|---|---|---|
| *H01L 27/32* | (2006.01) | |
| *H01L 51/52* | (2006.01) | |
| *H01L 51/00* | (2006.01) | |
| *H01L 33/58* | (2010.01) | |

(52) U.S. Cl.
CPC ...... *H01L 27/3258* (2013.01); *H01L 51/0096* (2013.01); *H01L 51/5253* (2013.01); *B32B 2457/206* (2013.01); *G09G 2300/0465* (2013.01)

(58) Field of Classification Search
CPC .... G09G 2300/0465; H01L 27/15–156; H01L 27/3225–3234; H01L 51/0032–0095; H01L 51/50–56; H01L 27/32–3297; H01L 2251/50–568; H01L 33/58–60; H01L 2933/0058; B32B 2457/206
See application file for complete search history.

(56) References Cited

U.S. PATENT DOCUMENTS

| | | | | |
|---|---|---|---|---|
| 7,402,467 | B1* | 7/2008 | Kadono | H01L 27/1214 438/151 |
| 9,632,487 | B2* | 4/2017 | Kim | H01L 27/3258 |
| 10,541,380 | B1* | 1/2020 | Sung | H01L 51/0097 |
| 10,615,369 | B2* | 4/2020 | Choi | H01L 27/3262 |
| 10,741,788 | B2* | 8/2020 | Won | H01L 51/5256 |
| 11,100,858 | B2* | 8/2021 | An | G09G 3/3233 |
| 2002/0179908 | A1* | 12/2002 | Arao | H01L 27/088 257/72 |
| 2011/0222179 | A1* | 9/2011 | Monadgemi | G02B 1/118 359/850 |
| 2013/0194205 | A1* | 8/2013 | Park | G06F 3/0445 345/173 |

(Continued)

*Primary Examiner* — Maliheh Malek
(74) *Attorney, Agent, or Firm* — Fenwick & West LLP

(57) ABSTRACT

A display device capable of reducing a non-display area includes a substrate including at least one hole area disposed within an emission area, and at least one blocking hole passing through inorganic insulating films disposed beneath a light emitting element while including upper and lower insulating films made of different materials. Side surfaces of the upper inorganic insulating film exposed through the blocking hole protrude beyond side surfaces of the lower inorganic insulating film exposed through the blocking hole, respectively. Accordingly, it is possible to minimize a bezel area, which is a non-display area, and to disconnect a light emitting stack by the blocking hole.

15 Claims, 10 Drawing Sheets

(56) References Cited

U.S. PATENT DOCUMENTS

| | | | | |
|---|---|---|---|---|
| 2015/0009436 A1* | 1/2015 | Kim | G02F 1/13725 | 349/33 |
| 2015/0144910 A1* | 5/2015 | Beak | H01L 27/1255 | 257/40 |
| 2016/0188061 A1* | 6/2016 | Cho | G06F 3/0446 | 345/173 |
| 2016/0351645 A1* | 12/2016 | You | H01L 27/326 | |
| 2017/0031323 A1* | 2/2017 | Kim | H01L 27/3258 | |
| 2017/0125506 A1* | 5/2017 | Kim | H01L 27/3265 | |
| 2017/0148856 A1* | 5/2017 | Choi | H01L 51/0096 | |
| 2017/0237038 A1* | 8/2017 | Kim | H01L 51/0096 | 257/40 |
| 2018/0123086 A1* | 5/2018 | Oh | H01L 27/3262 | |
| 2018/0182821 A1* | 6/2018 | Yun | H01L 27/3276 | |
| 2018/0226459 A1* | 8/2018 | Bae | H01L 27/124 | |
| 2019/0043934 A1* | 2/2019 | Ukigaya | G09G 3/3225 | |
| 2019/0051859 A1* | 2/2019 | Choi | H01L 51/0097 | |
| 2019/0173053 A1* | 6/2019 | Choi | G06F 3/0412 | |
| 2019/0181205 A1* | 6/2019 | Kim | H01L 51/5253 | |
| 2019/0245159 A1* | 8/2019 | Kim | H01L 51/5256 | |
| 2019/0288047 A1* | 9/2019 | Jeong | H01L 51/5256 | |
| 2019/0334120 A1* | 10/2019 | Seo | H01L 51/5246 | |
| 2019/0355930 A1* | 11/2019 | Lee | H01L 51/5253 | |
| 2019/0363279 A1* | 11/2019 | Yamaguchi | H01L 51/5072 | |
| 2019/0393274 A1* | 12/2019 | Park | G06F 3/0446 | |
| 2020/0020752 A1* | 1/2020 | Shi | H01L 51/5253 | |
| 2020/0073500 A1* | 3/2020 | Jeong | H01L 27/3244 | |
| 2020/0075692 A1* | 3/2020 | Park | H01L 27/3211 | |
| 2020/0105853 A1* | 4/2020 | Kwon | H01L 27/3272 | |
| 2020/0106046 A1* | 4/2020 | Kim | H01L 27/326 | |
| 2020/0106057 A1* | 4/2020 | Yoo | H01L 27/3225 | |
| 2020/0110525 A1* | 4/2020 | Park | H01L 27/3244 | |
| 2020/0111856 A1* | 4/2020 | Lee | H01L 27/3246 | |
| 2020/0127231 A1* | 4/2020 | Yun | H01L 51/5253 | |
| 2020/0135800 A1* | 4/2020 | Seo | H01L 27/3276 | |
| 2020/0135812 A1* | 4/2020 | Ohara | G06F 3/0412 | |
| 2020/0142525 A1* | 5/2020 | Han | G06F 1/1643 | |
| 2020/0144341 A1* | 5/2020 | Choi | H01L 51/0096 | |
| 2020/0152842 A1* | 5/2020 | Park | G06F 1/1626 | |
| 2020/0159369 A1* | 5/2020 | Seo | G06F 3/041 | |
| 2020/0161406 A1* | 5/2020 | Lee | G09G 3/20 | |
| 2020/0174295 A1* | 6/2020 | Baek | G02F 1/1339 | |
| 2020/0175901 A1* | 6/2020 | Lee | H01L 27/3276 | |
| 2020/0175918 A1* | 6/2020 | An | H01L 27/3276 | |
| 2020/0176551 A1* | 6/2020 | Park | H01L 27/3276 | |
| 2020/0194714 A1* | 6/2020 | Won | H01L 27/3225 | |
| 2020/0194721 A1* | 6/2020 | Lee | H01L 51/5246 | |
| 2020/0212140 A1* | 7/2020 | Huh | H01L 27/3234 | |
| 2020/0213699 A1* | 7/2020 | You | H04R 1/028 | |
| 2020/0365825 A1* | 11/2020 | Yu | H01L 27/3258 | |
| 2021/0201831 A1* | 7/2021 | Woo | G09G 3/2003 | |
| 2021/0242283 A1* | 8/2021 | Lee | H01L 27/323 | |
| 2021/0273026 A1* | 9/2021 | Seo | H01L 51/0096 | |

* cited by examiner

DISPLAY DEVICE

CROSS-REFERENCE TO RELATED APPLICATIONS

This application claims the benefit of Republic of Korea Patent Application No. 10-2018-0145431 filed on Nov. 22, 2018, which is hereby incorporated by reference as if fully set forth herein.

BACKGROUND

Field

The present disclosure relates to a display device, and more particularly to a display device capable of reducing a non-display area.

Discussion of the Related Art

An image display device, which renders a variety of information on a screen, is a core technology of the information age. Such an image display device is developing towards enhanced thinness, enhanced lightness, and enhanced portability as well as enhanced performance. In connection with this, a flat display device capable of eliminating disadvantages of heavy and bulky structures of cathode ray tubes (CRTs) is highlighted.

Representative examples of such a flat display device may include a liquid crystal display (LCD) device, a plasma display panel (PDP), an organic light emitting display (OLED) device, an electrophoretic display (ED) device, and the like.

Such a flat display device is employed in various types of appliances such as a television (TV), a monitor and a portable phone, and is being further advanced through addition of a camera, a speaker and a sensor thereto. However, the camera, the speaker, the sensor and the like are disposed in a non-display area of the display device and, as such, a bezel area, which is a non-display area, increases. For this reason, conventional display devices have a problem in that a display area is reduced.

SUMMARY

Accordingly, the present disclosure is directed to a display device that substantially obviates one or more problems due to limitations and disadvantages of the related art.

An object of the present disclosure is to provide a display device capable of reducing a non-display area.

Additional advantages, objects, and features of the invention will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a substrate including at least one hole area disposed within an emission area, and at least one blocking hole passing through inorganic insulating films disposed beneath a light emitting element while including upper and lower insulating films made of different materials. Side surfaces of the upper inorganic insulating film exposed through the blocking hole protrude beyond side surfaces of the lower inorganic insulating film exposed through the blocking hole, respectively. Accordingly, it may be possible to minimize a bezel area, which is a non-display area, and to disconnect a light emitting stack by the blocking hole.

It is to be understood that both the foregoing general description and the following detailed description of the present invention are exemplary and explanatory and are intended to provide further explanation of the disclosure as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the disclosure.

DETAILED DESCRIPTION

Hereinafter, preferred embodiments of the present disclosure will be described in detail with reference to the accompanying drawings.

Figure 1:
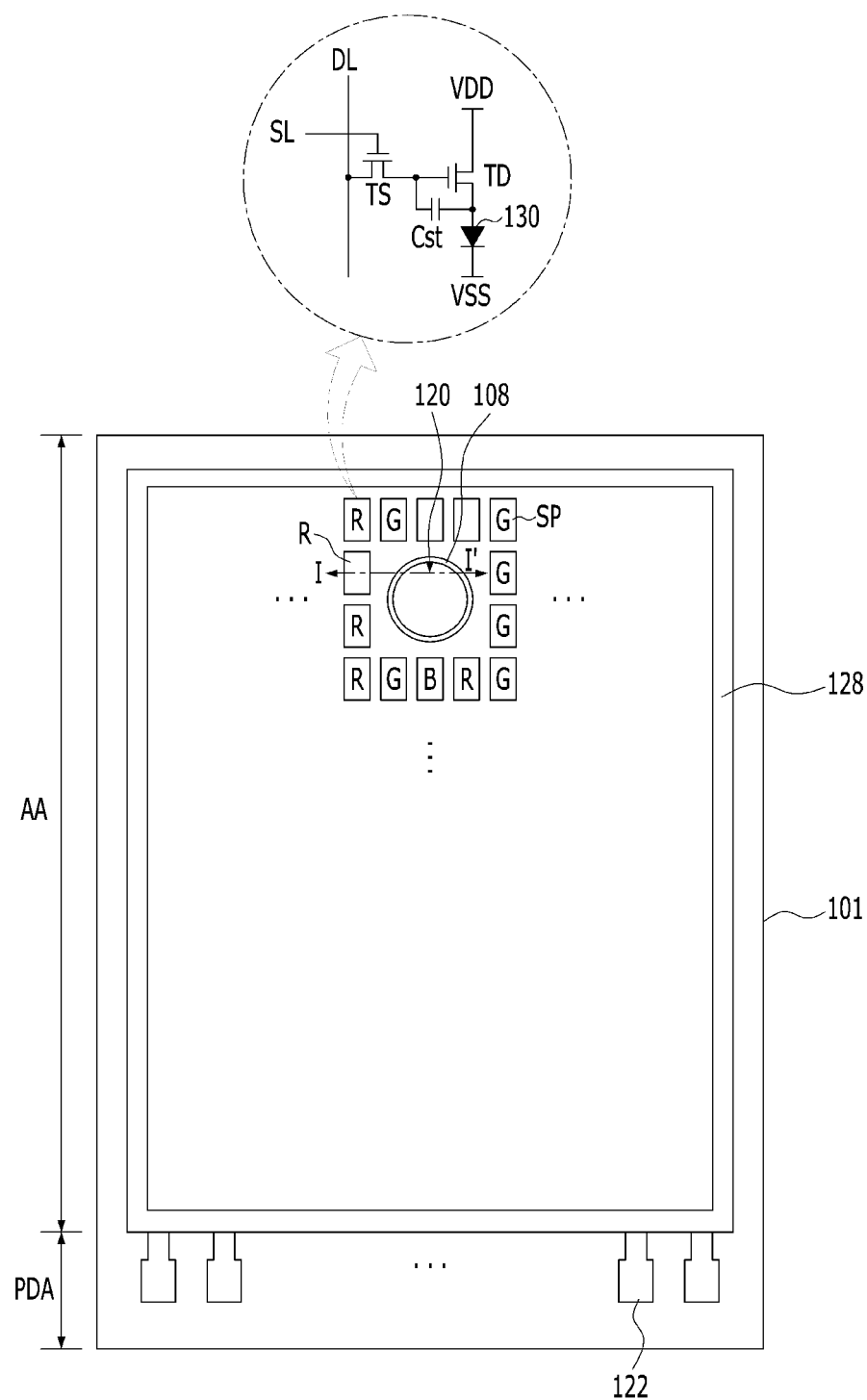
FIG. 1 is a view illustrating an organic light emitting display device according to an embodiment of the present disclosure.
Figure 2:
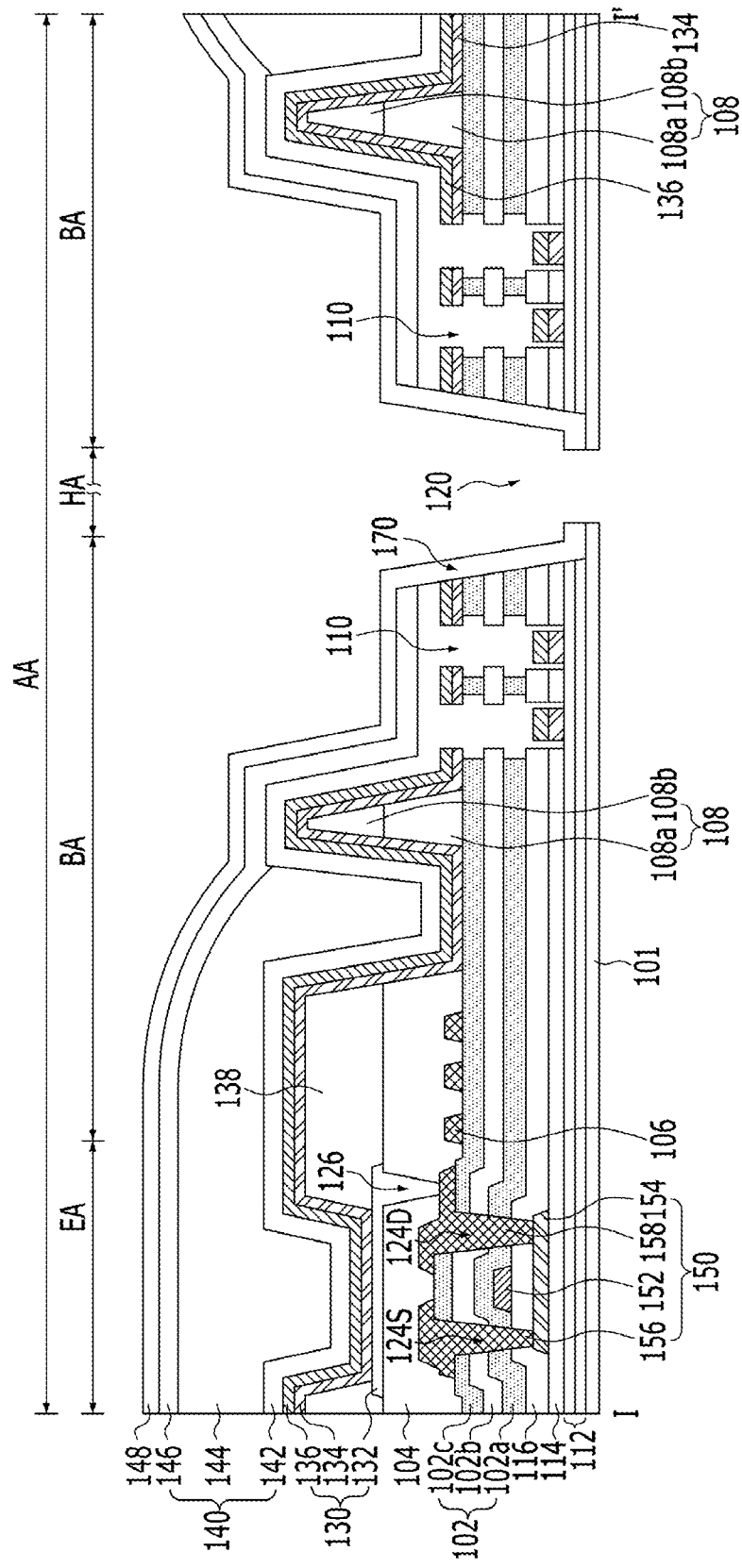
FIG. 2 is a cross-sectional view taken along line I -I of FIG. 1, illustrating the organic light emitting display device, which has a structure according to a first embodiment of the present disclosure.

Referring to FIGS. 1 and 2, a display device is illustrated. The display device includes an active area AA and a pad area PDA.

A plurality of pads 122 is formed in the pad area PDA, to supply drive signals to a plurality of signal lines disposed in the active area AA, respectively. Here, each signal line 106 includes at least one of a scan line SL, a data line DL, a high-voltage (VDD) supply line or a low-voltage (VSS) supply line.

The active area AA includes emission areas EA, a bezel area BA and a hole area HA.

Unit pixels, each of which includes a light emitting element 130, are disposed in the emission areas EA, respectively. Each unit pixel may be constituted by red (R), green (G), and blue (B) subpixels, as illustrated in FIG. 1, or may be constituted by red (R), green (G), blue (B), and white (W) subpixels. Each subpixel includes one light emitting element 130, and a pixel driving circuit for independently driving the light emitting element 130.

The pixel driving circuit includes a switching transistor TS, a driving transistor TD, and a storage capacitor Cst.

The switching transistor TS turns on when a scan pulse is supplied to a corresponding scan line SL. In this state, a data signal supplied to a corresponding data line DL is supplied to the capacitor Cst and a gate electrode of the driving transistor TD via the switching transistor TS.

The driving transistor TD controls current I supplied from a corresponding high-voltage (VDD) supply line to the light emitting element 130, in response to the data signal supplied to the gate electrode thereof, thereby adjusting the amount of light emitted from the light emission element 130. Even when the switching transistor TS turns off, the driving transistor TD supplies constant current I by a voltage charged in the storage capacitor Cst until a data signal of a next frame is supplied and, as such, the light emission element 130 maintains emission of light.

FIG. 2 illustrates a display device according to a first embodiment of the present disclosure. As illustrated in FIG. 2, the driving transistor TD, which is designated by reference numeral "150", includes an active layer 154 disposed on an active buffer layer 114, a gate electrode 152 overlapping with the active layer 154 under the condition that a gate insulating film 116 is interposed between the active layer 154 and the gate electrode 152, and a source electrode 156 and a drain electrode 158 formed on an interlayer insulating film 102 while contacting the active layer 154.

The active layer 154 is made of at least one of an amorphous semiconductor material, a polycrystalline semiconductor material, or an oxide semiconductor material. The active layer 154 includes a channel region, a source region, and a drain region. The channel region overlaps with the gate electrode 152 under the condition that the gate insulating film 116 is interposed between the channel region and the gate electrode 152 and, as such, the channel region is defined between the source electrode 156 and the drain electrode 158. The source region is electrically connected to the source electrode 156 via a source contact hole 124S passing through the gate insulating film 116 and the interlayer insulating film 102. The drain region is electrically connected to the drain electrode 158 via a drain contact hole 124D passing through the gate insulating film 116 and the interlayer insulating film 102.

A multi-buffer layer 112 and an active buffer layer 114 are disposed between the active layer 154 and a substrate 101. The multi-buffer layer 112 functions to delay diffusion of moisture and/or oxygen penetrating into the substrate 101. The active buffer layer 114 performs functions of protecting the active layers 154 and blocking various kinds of defects propagated from the substrate 101. At least one of the multi-buffer layer 112, the active buffer layer 114, or the substrate 101 has a multilayer structure.

In this case, the uppermost layer of the multi-buffer layer 112 contacting the active buffer layer 114 is made of a material having etching characteristics different from those of the remaining layers of the multi-buffer layer 112, the active buffer layer 114, and the gate insulating layer 116. The uppermost layer of the multi-buffer layer 112 contacting the active buffer layer 114 is made of one of $SiN_x$ and $SiO_x$. The remaining layers of the multi-buffer layer 112, the active buffer layer 114, and the gate buffer layer 116 may be made of the other of $SiN_x$ and $SiO_x$. For example, the uppermost layer of the multi-buffer layer 112 contacting the active buffer layer 114 is made of $SiN_x$, whereas the remaining layers of the multi-buffer layer 112, the active buffer layer 114, and the gate buffer layer 116 are made of $SiO_x$.

The light emitting element 130 includes an anode 132 connected to the drain electrode 158 of the driving transistor (TD) 150, at least one light emitting stack 134 formed on the anode 132, and a cathode 136 formed on the light emitting stack 134, to be connected to a low-voltage (VSS) supply line. Here, the low-voltage (VSS) supply line supplies a voltage lower than a high voltage supplied through a high-voltage (VDD) supply line.

The anode 132 is electrically connected to the drain electrode 158 of the driving transistor (TD) 150 exposed through a pixel contact hole 126 passing through a planarization layer 104 disposed on the driving transistor (TD) 150. The anode 132 of each subpixel is disposed on the planarization layer 104 without being covered by a bank 138 such that at least a part of the anode 132 is exposed.

When the anode 132 as described above is applied to a bottom emission type organic light emitting display device, the anode 132 is constituted by a transparent conductive film made of indium tin oxide (ITO) or indium zinc oxide (IZO). On the other hand, when the anode 132 is applied to a top emission type organic light emitting display device, the anode 132 is formed to have a multilayer structure including a transparent conductive film and an opaque conductive film having high reflection efficiency. The transparent conductive film is made of a material having a relatively high work function, for example, indium tin oxide (ITO) or indium zinc oxide (IZO). The opaque conductive film is formed to have a single-layer structure or a multilayer structure including Al, Ag, Cu, Pb, Mo, Ti or an alloy thereof. For example, the anode 132 is formed to have a structure in which a transparent conductive film, an opaque conductive film and a transparent conductive film are sequentially laminated.

The light emitting stack 134 is formed by laminating a hole transport layer, a light emitting layer, and an electron transport layer on the anode 132 in this order or in reverse order.

The cathode 136 is formed on upper surfaces and side surfaces of the light emitting stack 134 and the bank 138, to face the anode 132 under the condition that the light emitting stack 134 is interposed between the anode 132 and the cathode 136.

An encapsulation unit 140 is formed to prevent penetration of external moisture or oxygen into the light emitting element 130, which is weak against moisture or oxygen. To this end, the encapsulation unit 140 includes a plurality of inorganic encapsulation layers 142 and 146, and an organic encapsulation layer 144 disposed between adjacent ones of the inorganic encapsulation layers 142 and 146. The inorganic encapsulation layer 146 is disposed at an uppermost position of the encapsulation unit 140. In this case, the encapsulation unit 140 includes at least one inorganic encapsulation layer 142 or 146 and at least one organic layer 144. The following description will be given in conjunction with an example in which the encapsulation unit 140 has a structure including a first inorganic encapsulation layer 142 and a second inorganic encapsulation layer 146, and one organic encapsulation layer 144 disposed between the first and second inorganic encapsulation layers 142 and 146 in accordance with the present disclosure.

The first inorganic encapsulation layer 142 is formed on the substrate 101 formed with the cathode 136 such that the first inorganic encapsulation layer 142 is disposed closest to the light emitting element 130. The first inorganic encapsulation layer 142 is made of an inorganic insulating material capable of being deposited at low temperature, for example, silicon nitride (SiN$_x$), silicon oxide (SiO$_x$), silicon oxynitride (SiON) or aluminum oxide (Al$_2$O$_3$). As such, the inorganic encapsulation layer 142 may be deposited in a low-temperature atmosphere. Accordingly, it may be possible to prevent damage to the light emitting stack 134, which is weak in a high-temperature atmosphere during deposition of the first inorganic encapsulation layer 142.

The second inorganic encapsulation layer 146 is formed to cover upper and side surfaces of the organic encapsulation layer 144 and an exposed upper surface of the first inorganic encapsulation layer 142 not covered by the organic encapsulation layer 144. As a result, upper and lower surfaces of the organic encapsulation layer 144 are sealed by the first and second inorganic encapsulation layers 142 and 146 and, as such, it may be possible to minimize or prevent penetration of external moisture or oxygen into the organic encapsulation layer 144 or penetration of moisture or oxygen present within the organic encapsulation layer 144 into the light emitting element 130. The second inorganic encapsulation layer 146 is made of an inorganic insulating material such as silicon nitride (SiN$_x$), silicon oxide (SiO$_x$), silicon oxynitride (SiON) or aluminum oxide (Al$_2$O$_3$).

The organic encapsulation layer 144 serves as a buffer to buffer stress generated among layers during bending of the organic light emitting display device while enhancing planarization performance. In addition, the organic encapsulation layer 144 is formed to have a greater thickness than the inorganic encapsulation layers 142 and 146, in order to prevent formation of cracks or pin holes caused by foreign matter. The organic encapsulation layer 144 is made of an organic insulating material such as acryl resin, epoxy resin, polyimide, polyethylene, or silicon oxycarbide (SiOC).

Upon formation of the organic encapsulation layer 144, an outer dam 128 and an inner dam 108 are formed in order to restrict flowability of the organic encapsulation layer 144.

As illustrated in FIG. 1, at least one outer dam 128 may be formed to completely enclose the active area AA where light emitting elements 130 are disposed or may be formed only in an area between the active area AA and the pad area PDA. When a pad area PDA formed with a plurality of pads 122 is disposed at one side of the substrate 101, the outer dam 128 is disposed only at one side of the substrate 101. On the other hand, when pad areas PDA each formed with a plurality of pads 122 are disposed at opposite sides of the substrate 101, respectively, outer dams 128 are disposed at the opposite sides of the substrate 101, respectively. When plural outer dams 128 are disposed, the outer dams 128 are disposed in parallel while being spaced apart from one another by a certain distance. By virtue of such an outer dam 128, it may be possible to prevent diffusion of the inorganic encapsulation layer 144 into the pad area PDA.

At least one inner dam 108 is disposed to completely enclose a substrate hole 120 disposed in the hole area HA. When plural inner dams 108 are disposed, the inner dams 108 are disposed in parallel while being spaced apart from one another by a certain distance. Such an inner dam 108 is formed to have a single-layer structure or a multilayer structure including layers 108a and 108b, similarly to the outer dam 128. For example, each of the inner dam 108 and the outer dam 128 is formed simultaneously with at least one of the planarization layer 104, the bank 138 or a spacer (not shown), using the same material, and, as such, use of an additional mask process and an increase in costs may be prevented. By virtue of such an inner dam 108, the organic encapsulation layer 144, which may function as a moisture penetration path, may be prevented from being diffused into the hole area HA.

The bezel area BA is disposed between the hole area HA and the emission areas EA disposed adjacent to the hole area HA. In the bezel area BA, the above-described inner dam 108, at least one blocking hole 110 and a through hole 170 are disposed.

Each blocking hole 110 is disposed between each inner dam 108 and the substrate hole 120. The blocking hole 110 is formed to pass through at least one of the multi-buffer layer 112, the active buffer layer 114, the gate insulating film 116, or the interlayer insulating film 102 having a multilayer structure disposed between the substrate 101 and the planarization layer 104. In this case, the interlayer insulating film 102, which has a multilayer structure, includes layers of different inorganic insulating materials alternately laminated between the gate electrode 152 and the source and drain electrodes 156 and 158. The following description will be given in conjunction with a structure of the interlayer insulating film 102 in which a second interlayer insulating film 102b is interposed between first and third interlayer insulating film 102a and 102c while being made of a material different from those of the first and third interlayer insulating film 102a and 102c in accordance with the present disclosure, as illustrated in FIG. 3A or 3B.

Figure 3A:
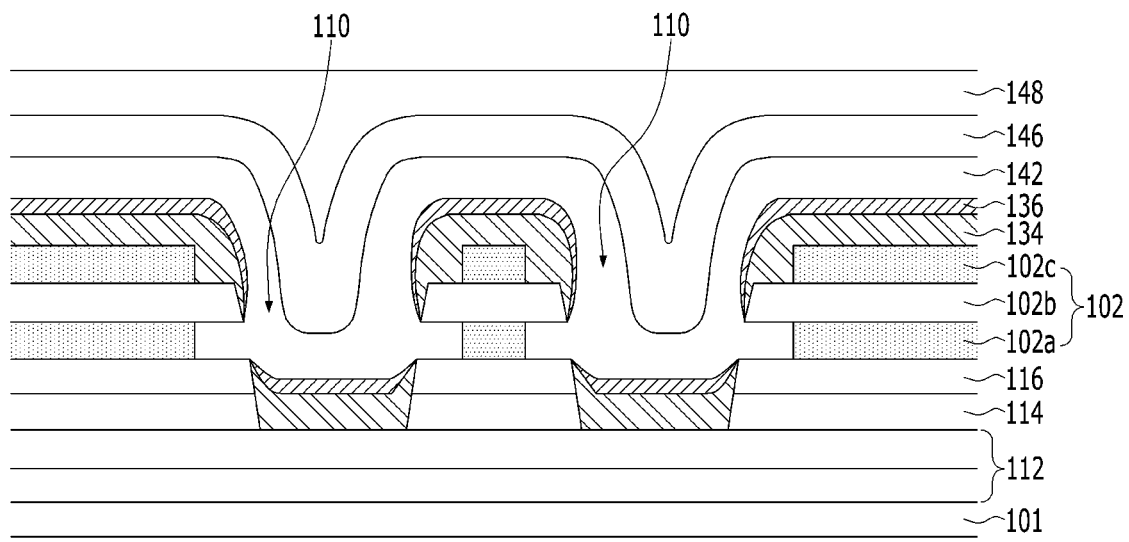
FIGS. 3A and 3B are cross-sectional views illustrating embodiments of a blocking hole illustrated in FIG. 2.

When the first and third interlayer insulating films 102a and 102c in the case of FIG. 3A are made of SiN$_x$, the second interlayer insulating film 102b may be made of SiO$_x$. In this case, side surfaces of the second interlayer insulating film 102b exposed through the blocking hole 110 may protrude beyond those of the first and third interlayer insulating films 102a and 102c. Meanwhile, the active buffer layer 114 and the gate insulating film 116 contacting the active layer 154 are made of the same material as the second interlayer insulating film 102b, that is, SiO$_x$, in order to prevent diffusion of hydrogen into the active layer 154. As such, side surfaces of the active buffer layer 114 and the gate insulating film 116 may also protrude beyond those of the first and third interlayer insulating films 102a and 102c.

Since the side surfaces of the second interlayer insulating film 102b exposed through the blocking hole 110 protrude beyond those of the first and third interlayer insulating films 102a and 102c, as described above, the first interlayer insulating film 102a disposed beneath the second interlayer insulating film 102b includes an undercut.

Figure 3B:
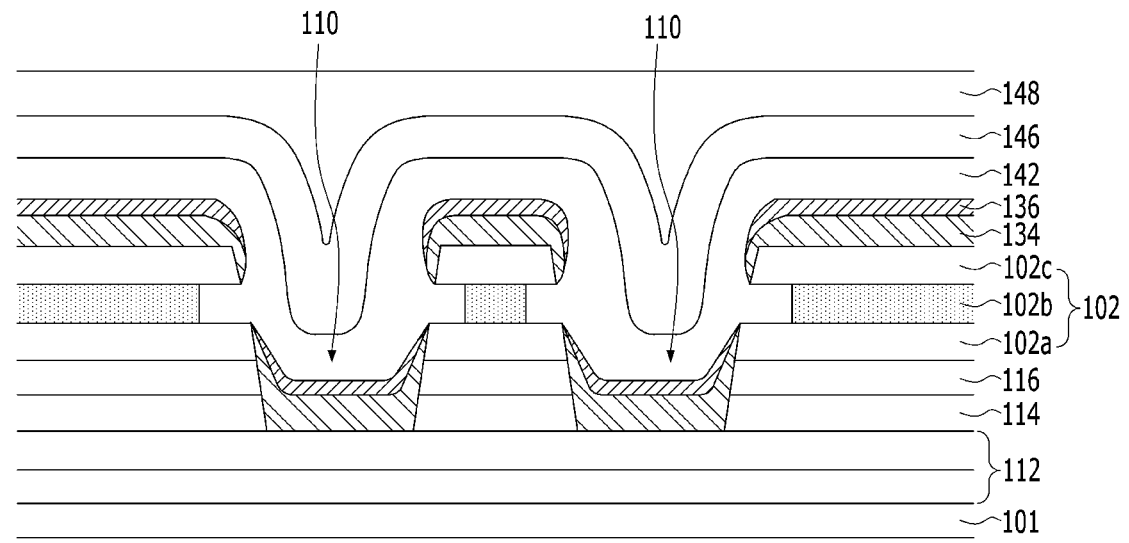

When the first and third interlayer insulating films 102 and 102c in the case of FIG. 3B are made of SiO$_x$, the second interlayer insulating film 102b may be made of SiN$_x$. In this case, side surfaces of the first and third interlayer insulating films 102a and 102c exposed through the blocking hole 110 protrude beyond those of the second interlayer insulating film 102b. As such, the second interlayer insulating film 102b disposed beneath the third interlayer insulating film 102c may include an undercut.

By virtue of the undercut of the first interlayer insulating film 102a illustrated in FIG. 3A or the undercut of the second interlayer insulating film 102b illustrated in FIG. 3B, the light emitting stack 134 and the cathode 136 are formed to be disconnected without having continuance within the blocking hole 110. Accordingly, even when external moisture penetrates along the light emitting stack 134 disposed near the hole area HA, it may be possible to prevent or delay introduction of the penetrated moisture into the emission area EA by the blocking hole 110. In addition, even when static electricity is introduced along the cathode 136 disposed near the hole area HA, diffusion of the introduced static electricity into the emission area EA may be prevented by the blocking hole 110. Furthermore, the blocking hole 110 exhibits great hardness, as compared to organic insulating materials, and, as such, it may be possible to prevent propagation of cracks into the emission area EA through removal of the inorganic insulating layers 114, 116, and 102, which may easily generate cracks when subjected to bending stress.

Meanwhile, in the case illustrated in FIG. 3A, the side surfaces of the second interlayer insulating film 102b (upper inorganic insulating film) protrude beyond those of the first interlayer insulating film 102a (lower inorganic insulating film) by about 0.1 to 0.2 μm. On the other hand, in the case illustrated in FIG. 3B, the side surfaces of the third interlayer insulating film 102c (upper inorganic insulating film) protrude beyond those of the second interlayer insulating film 102b (lower inorganic insulating film) by about 0.1 to 0.2 μm.

When the side surfaces of the upper inorganic insulating film protrude beyond those of the lower inorganic insulating film by less than 0.1 μm, the light emitting stack 134 and the cathode 136 are formed without being disconnected. As a result, moisture, static electricity, and cracks may be diffused into the emission area EA along the light emitting stack 134.

On the other hand, when the side surfaces of the upper inorganic insulating film protrude beyond those of the lower inorganic insulating film by more than 0.2 μm, the lower inorganic insulating film cannot withstand the weight of the upper inorganic insulating film and, as such, protruding portions of the upper inorganic insulating film may collapse.

An inorganic cover layer 148 made of an inorganic insulating material is formed on the encapsulation unit 140. The inorganic cover layer 148 seals interfaces among the plural thin films 112, 114, 116, 102, 142, 146, 136, and 134 exposed through the through hole 170 and, as such, it may be possible to minimize or prevent penetration of external moisture or oxygen into the interfaces of the plural thin films.

The through hole 170 is formed to pass through a plurality of thin film layers disposed between the substrate 101 and the inorganic cover layer 148. For example, the through hole 170 is formed to pass through portions of the inorganic insulating layers 112, 114, 116, and 102, the light emitting stack 134, the cathode 136, and the inorganic encapsulation layers 142 and 146 disposed in the hole area HA and an area disposed therearound, thereby exposing an upper surface of the substrate 101. As the portions of the inorganic insulating layers 112, 114, 116, and 102, the light emitting stack 134, the cathode 136, and the inorganic encapsulation layers 142 and 146 are removed by virtue of the through hole 170, simplification of a laser trimming process may be achieved.

Since the hole area HA is disposed within the active area AA, the hole area HA may be surrounded by a plurality of subpixels SP disposed in the active area AA. Although the hole area HA is illustrated as having a circular shape, the hole area HA may be formed to have a polygonal shape or an oval shape.

Figure 4:
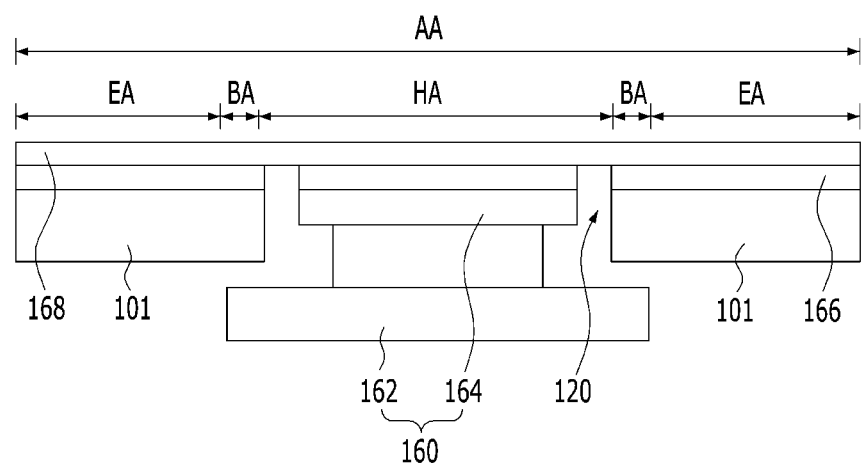
FIG. 4 is a cross-sectional view illustrating a camera module fitted in a substrate hole illustrated in FIG. 2 according to an embodiment of the present disclosure.

An electronic component including a camera, a speaker, a flash light source or a biometric sensor such as a fingerprint sensor is disposed in the hole area HA. The following description will be given in conjunction with an example in which a camera module 160 is disposed in the hole area HA in accordance with the present disclosure, as illustrated in FIG. 4.

The camera module 160 includes a camera lens 164 and a camera driver 162.

The camera driver 162 is disposed at a lower surface of the substrate 101, which is included in a display panel, such that the camera driver 162 is connected to the camera lens 164.

The camera lens 164 is disposed within the substrate hole 120 extending from a lower thin film layer (for example, the substrate 101 or a back plate) disposed at a lowermost position of the active area AA to an upper thin film layer (for example, a polarization plate 166) disposed at an uppermost position of the active area AA. Accordingly, the camera lens 164 is disposed to face a cover glass 168. In this case, the substrate hole 120 is disposed to overlap with the through hole 170 while having a smaller width than the through hole 170. The substrate hole 120 may be disposed to pass through the substrate 101, the inorganic insulating layer 148, and the polarization plate 166, or may be disposed to pass through the substrate 101 and the polarization plate 166.

As the camera module 160 is disposed within the active area AA, it may be possible to minimize the bezel area, which is a non-display area of the display device.

Figure 5A:
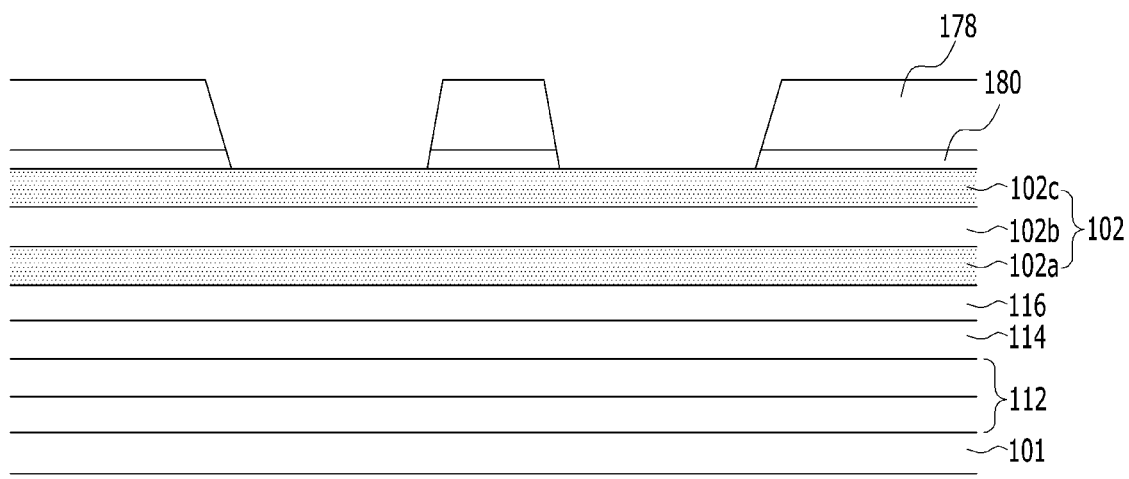
FIGS. 5A to 5C are cross-sectional views explaining a method for forming a blocking hole illustrated in FIG. 3A according to an embodiment of the present disclosure.
Figure 5B:
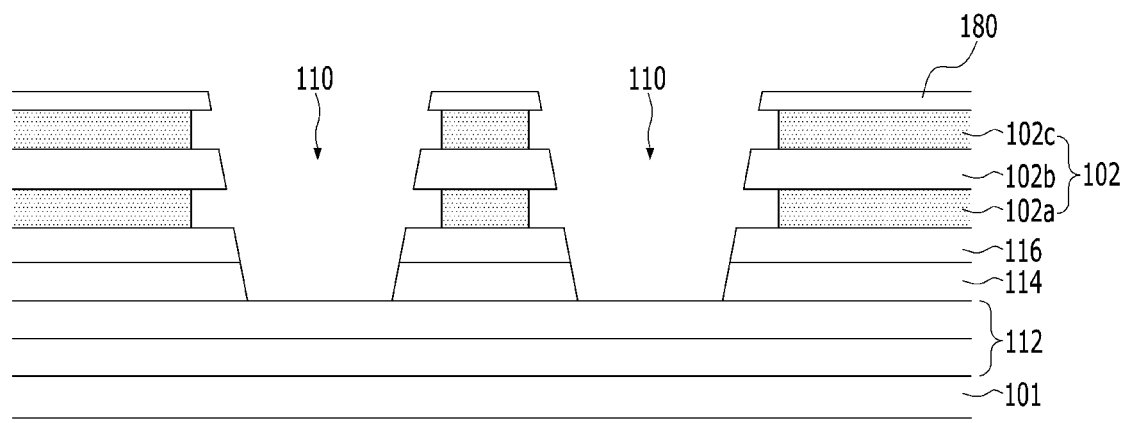
Figure 5C:
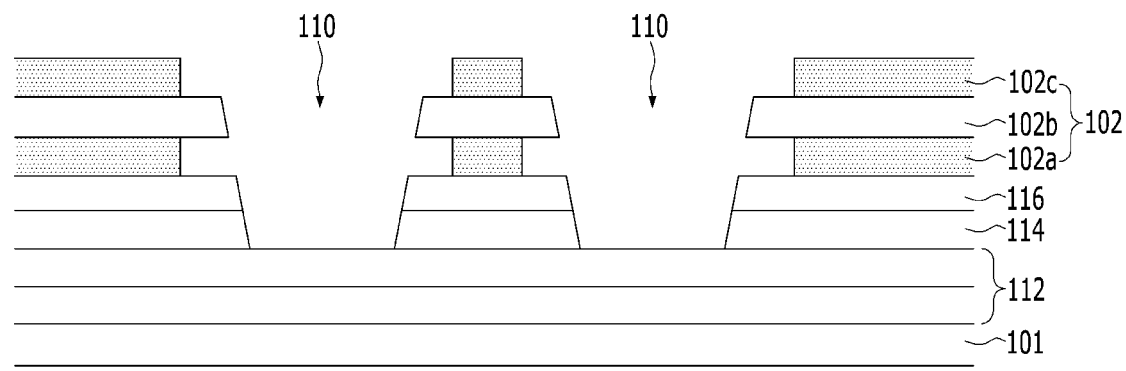

FIGS. 5A to 5C are cross-sectional views explaining a method for forming each blocking hole 110 illustrated in FIG. 3A according to an embodiment of the present disclosure.

As illustrated in FIG. 5A, the substrate 101, on which the multi-buffer layer 112, the active buffer layer 114, the gate insulating film 116 and the interlayer insulating film 102 having a multilayer structure are sequentially laminated, is first prepared. Thereafter, a hard mask layer is formed over the entire upper surface of an uppermost layer of the interlayer insulating film 102 having a multilayer structure. In this case, the hard mask layer is formed to have a single-layer structure or a multilayer structure, using at least one of ITO, MoTi, Mo, or Ti. A photoresist pattern 178 is then formed on the hard mask layer through a photolithography process using a photomask. A hard mask pattern 180 is subsequently formed through an etching process using the photoresist pattern 178 as a mask.

Next, the interlayer insulating film 102, the gate insulating film 116 and the active buffer layer 114 are primarily etched through a dry etching process using the hard mask pattern 180 and the photoresist pattern 178 as a mask, thereby forming each blocking hole 110, as illustrated in FIG. 5B. In this case, the first and third interlayer insulating films 102a and 102c exhibit higher etching rates than the second interlayer insulating film 102b and, as such, side surfaces of the second interlayer insulating film 102b protrude beyond those of the first and third interlayer insulating films 102a and 102c. In addition, the photoresist pattern 178 is removed while reacting with dry etching gas during the dry etching process because the dry etching process is carried out for a long time due to a great depth of each blocking hole 110.

Thereafter, the first and third interlayer insulating films 102a and 102c are selectively etched through a wet etching process using the hard mask pattern 180 as a mask. As a result, the side surfaces of the second interlayer insulating film 102b further protrude beyond those of the first and third interlayer insulating films 102a and 102c, as illustrated in FIG. 5C.

Subsequently, the hard mask pattern 180 is removed through an etching process.

Meanwhile, although formation of each blocking hole 110 has been described as being carried out through a dry etching process and a wet etching process in the case of FIGS. 5A to 5C, the blocking hole 110 may be formed only through a dry etching process without using a wet etching process. That is, after primary dry etching of the first to third interlayer insulating films 102a, 102b, and 102c, the gate insulating film 116 and the active buffer layer 114, the first and third interlayer insulating films 102a and 102c (or the second interlayer insulating film 102b) made of $SiN_x$ are selectively secondarily dry-etched. Selective secondary dry etching of the gate insulating film 116, the active buffer layer 114 and the first and third interlayer insulating films 102a and 102c (or the second interlayer insulating film 102b) made of $SiN_x$ is achieved by adjusting power used in the secondary dry etching to be lower than that of the primary dry etching.

Meanwhile, each blocking hole 110 may be formed before or after formation of pixel contact holes 126 or before or after formation of the source and drain contact holes 124S and 124D.

Figure 6:
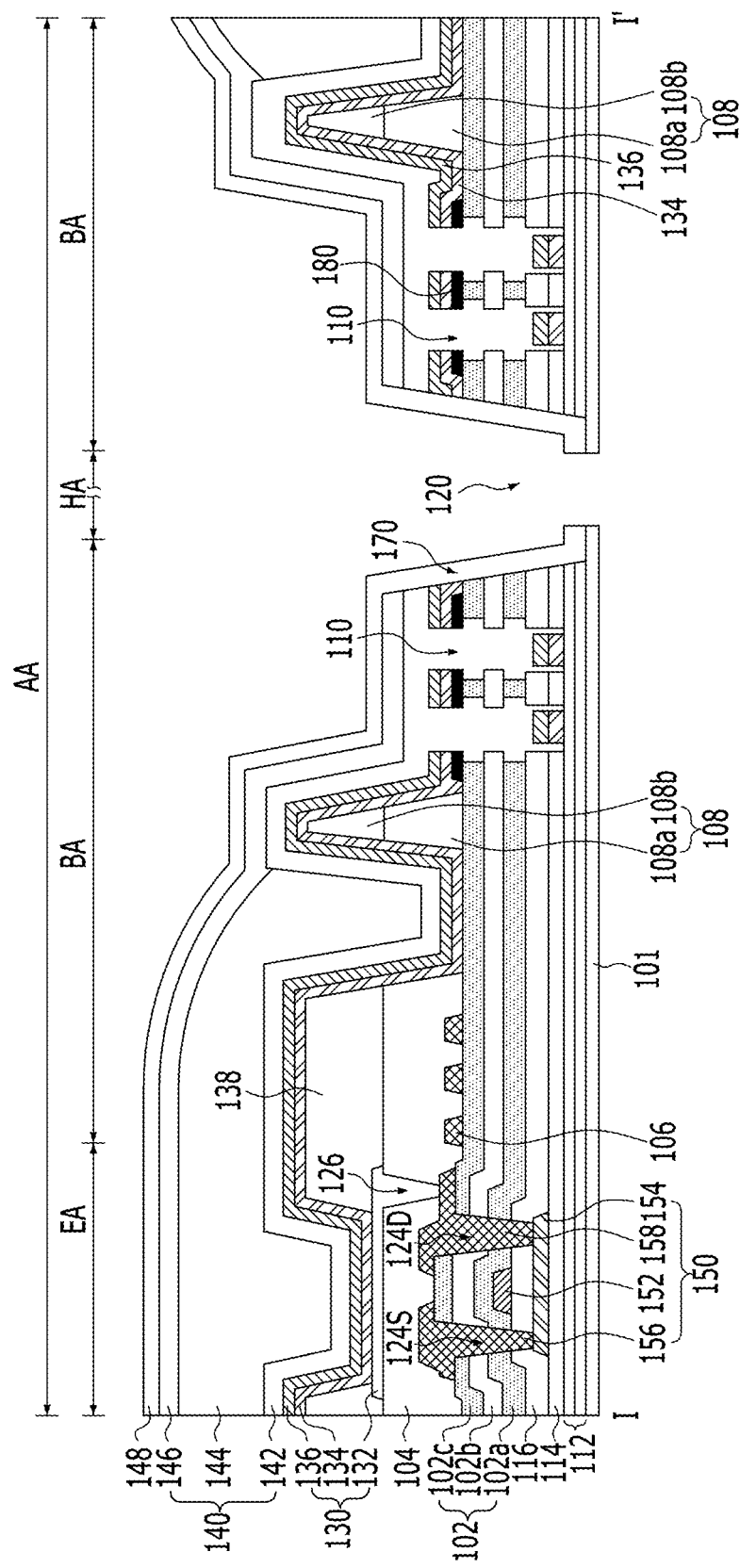
FIG. 6 is a cross-sectional view illustrating a display device according to a second embodiment of the present disclosure.

FIG. 6 is a cross-sectional view illustrating a display device according to a second embodiment of the present disclosure.

The display device illustrated in FIG. 6 includes the same constituent elements as those of the display device illustrated in FIG. 2, except that a hard mask pattern 180 is further included. Accordingly, no detailed description will be given of the same constituent elements for the sake of brevity.

The hard mask pattern 180 is formed on the uppermost interlayer insulating film 102c of the interlayer insulating film 102 having a multilayer structure, using one of ITO, MoTi, Mo, and Ti, to have a single-layer structure or a multilayer structure. Although the hard mask pattern 180 is removed in the above-described process of FIGS. 5A-5C, the hard mask pattern 180 is left on the substrate 101 without being removed in this case. For example, a photoresist pattern having a multi-step structure may be formed through a photolithography process using a half-tone mask, and the hard mask pattern 180 may then be selectively left in an area around each blocking hole 110 through an etching process using the photoresist pattern having the multi-step structure. Otherwise, the hard mask pattern 180 may be selectively left in the area around each blocking hole 110 through an additional mask process after execution of the wet etching process illustrated in FIG. 5C.

Figure 7:
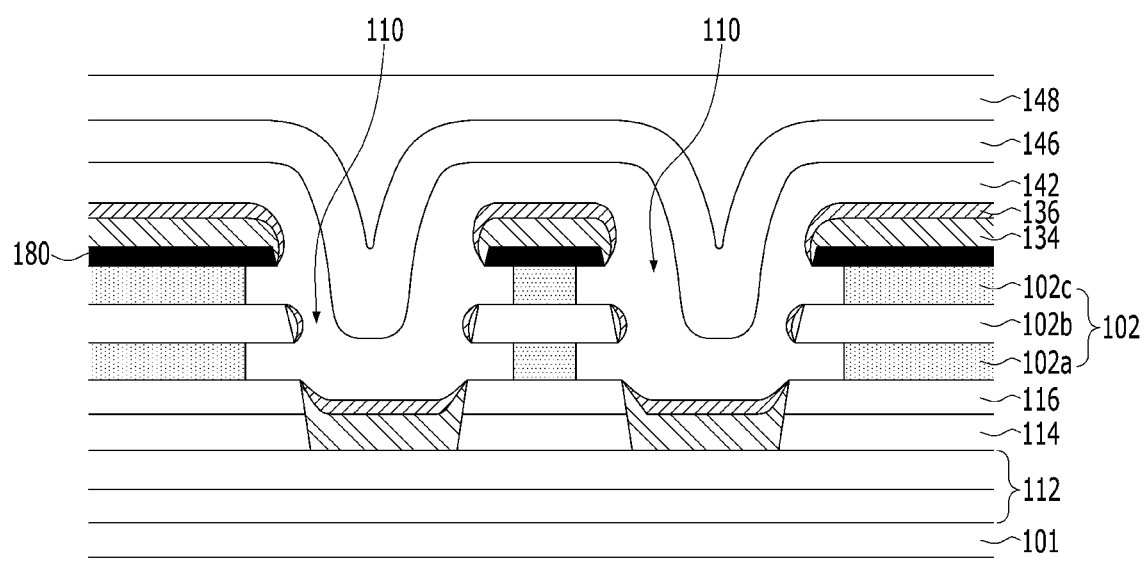
FIG. 7 is a cross-sectional view of a blocking hole illustrated in FIG. 6 according to an embodiment of the present disclosure.

In this case, as illustrated in FIG. 7, side surfaces of the hard mask pattern 180 exposed through each blocking hole 110 protrude beyond those of the uppermost interlayer insulating film, that is, the third interlayer insulating film 102c, by about 0.1 to 0.2 µm. Accordingly, the uppermost interlayer insulating film disposed beneath the hard mask pattern 180, that is, the third interlayer insulating film 102c, includes a first undercut.

Meanwhile, the first and third interlayer insulating films 102a and 102c are made of materials different from that of the second interlayer insulating film 102b. For example, the first and third interlayer insulating films 102a and 102c are made of $SiN_x$, whereas the second interlayer insulating film 102b is made of $SiO_x$. In this case, side surfaces of the second interlayer insulating film 102b exposed through each blocking hole 110 protrude beyond those of the first and third interlayer insulating films 102a and 102c. Accordingly, the first interlayer insulating film 102a disposed beneath the second interlayer insulating film 102b includes a second undercut because the side surfaces of the second interlayer insulating film 102b exposed through each blocking hole 110 protrude beyond those of the first and third interlayer insulating films 102a and 102c by about 0.1 to 0.2 µm.

By virtue of the undercuts of the first and third interlayer insulating films 102a and 102c, the light emitting stack 134 and the cathode 136 are formed to be disconnected without having continuance in each blocking hole 110. In this case, since the interlayer insulating film 102 illustrated in FIG. 6 includes the first and second undercuts, it may be possible to reduce failure of disconnection of the light emitting stack 134, as compared to the interlayer insulating film 102 of FIG. 2 including one undercut. As a result, even when external moisture penetrates along the light emitting stack 134 disposed near the hole area HA, it may be possible to more efficiently prevent or delay introduction of the penetrated moisture into the emission area EA by the blocking hole 110. In addition, even when static electricity is introduced along the cathode 136 disposed near the hole area HA, diffusion of the introduced static electricity into the emission area EA may be more efficiently prevented by the blocking hole 110. Furthermore, the blocking hole 110 exhibits great hardness, as compared to organic insulating materials, and, as such, it may be possible to prevent propagation of cracks into the emission area EA through removal of the inorganic insulating layers 114, 116 and 102, which may easily generate cracks when subjected to bending stress.

Figure 8:
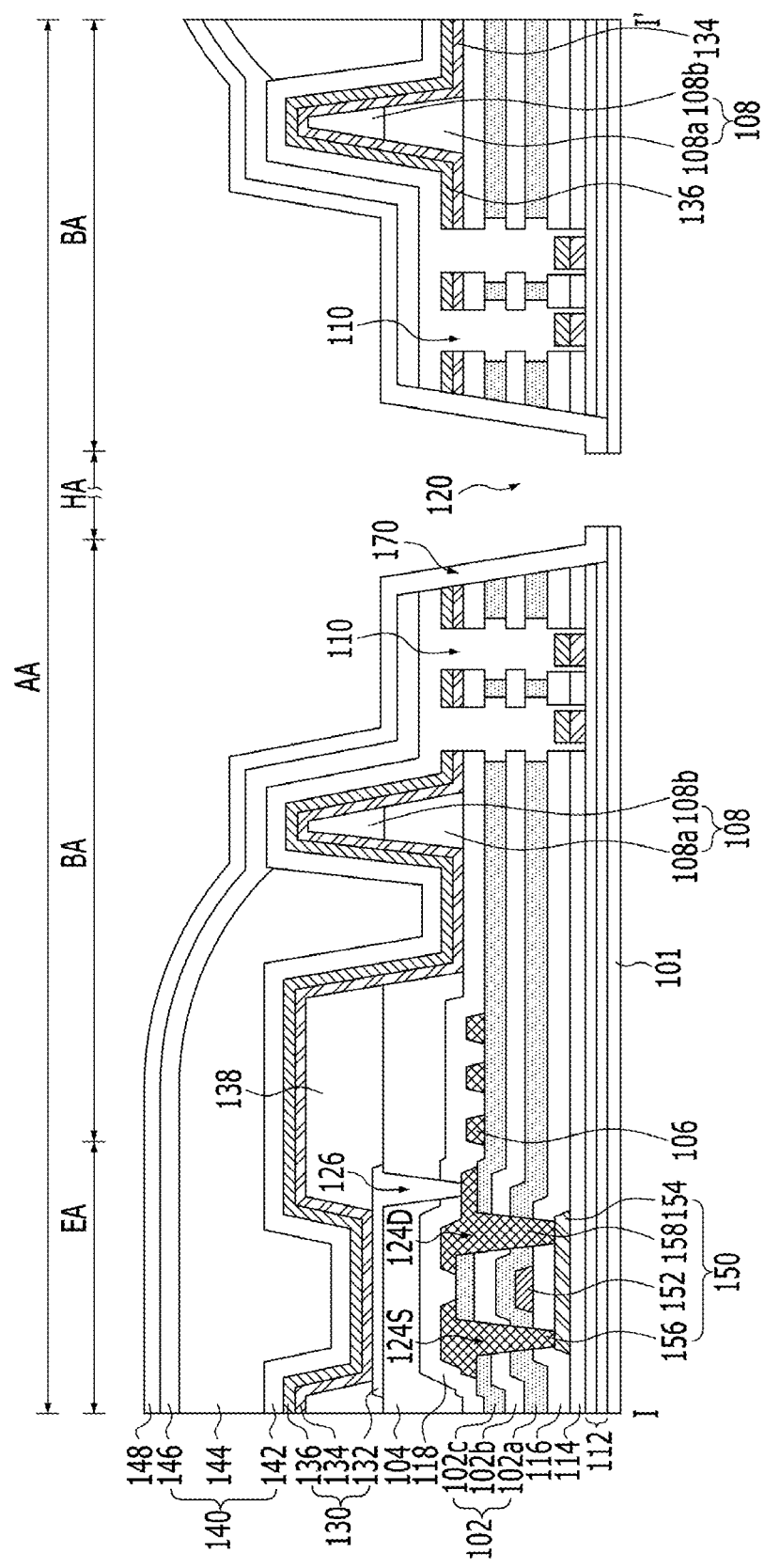
FIG. 8 is a cross-sectional view illustrating a display device according to a third embodiment of the present disclosure.

FIG. 8 is a cross-sectional view illustrating a display device according to a third embodiment of the present disclosure.

The display device illustrated in FIG. 8 includes the same constituent elements as those of the display device illustrated in FIG. 2, except that a passivation film 118 is further included. Accordingly, no detailed description will be given of the same constituent elements for the sake of brevity.

Figure 9:
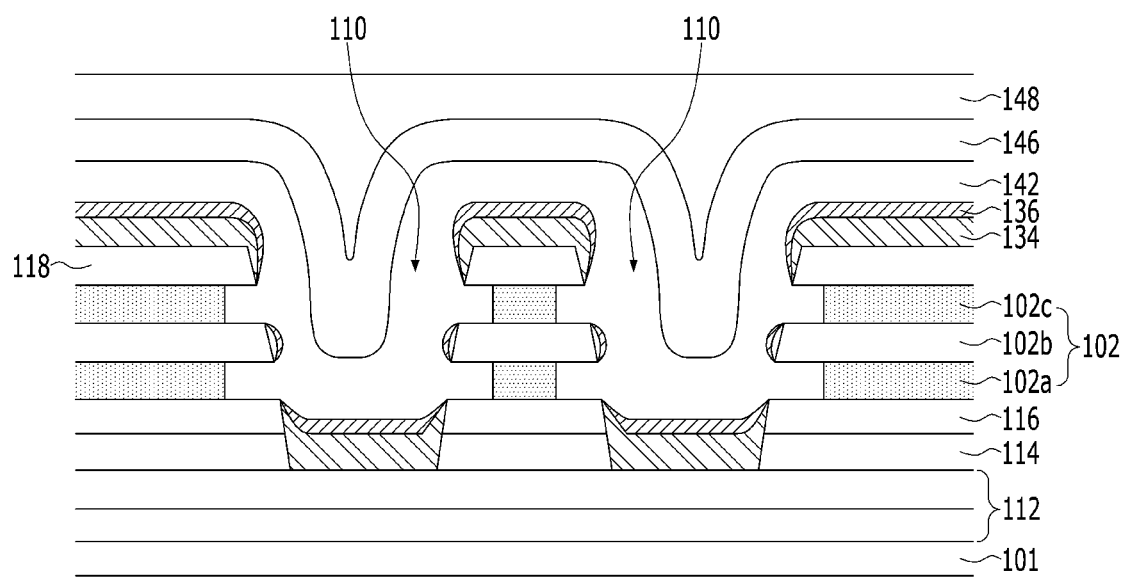
FIG. 9 is a cross-sectional view of a blocking hole illustrated in FIG. 6 according to an embodiment of the present disclosure.

The passivation film 118 is formed between the thin film transistor (TD) 150 and the anode 132. That is, the passivation film 118 is disposed on the uppermost interlayer insulating film 102c of the interlayer insulating film 102 having a multilayer structure. The passivation film 118 is made of a material different from that of the third interlayer insulating film 102c, which is the uppermost interlayer insulating film. For example, the passivation film 118 and the second interlayer insulating film 102b are made of $SiO_x$, whereas the first and third interlayer insulating films 102a and 102c are made of $SiN_x$. Accordingly, side surfaces of the passivation film 118 exposed through each blocking hole 110 protrude beyond those of the third interlayer insulating film 102c, as illustrated in FIG. 9, and, as such, the third interlayer insulating film 102c disposed beneath the passivation film 118 includes a first undercut. In addition, side surfaces of the second interlayer insulating film 102b exposed through each blocking hole 110 protrude beyond those of the first and third interlayer insulating films 102a and 102c and, as such, the first interlayer insulating film 102a disposed beneath the second interlayer insulating film 102b includes a second undercut.

By virtue of the undercuts of the first and third interlayer insulating films 102a and 102c, the light emitting stack 134 and the cathode 136 are formed to be disconnected without having continuance in each blocking hole 110. In this case, since the interlayer insulating film 102 illustrated in FIG. 8 includes the first and second undercuts, it may be possible to reduce failure of disconnection of the light emitting stack 134, as compared to the interlayer insulating film 102 of FIG. 2 including one undercut. As a result, even when external moisture penetrates along the light emitting stack 134 disposed near the hole area HA, it may be possible to more efficiently prevent or delay introduction of the penetrated moisture into the emission area EA by the blocking hole 110. In addition, even when static electricity is introduced along the cathode 136 disposed near the hole area HA, diffusion of the introduced static electricity into the emission area EA may be more efficiently prevented by the blocking hole 110. Furthermore, the blocking hole 110 exhibits great hardness, as compared to organic insulating materials, and, as such, it may be possible to prevent propagation of cracks into the emission area EA through removal of the inorganic insulating layers 114, 116, and 102, which may easily generate cracks when subjected to bending stress.

Figure 10:
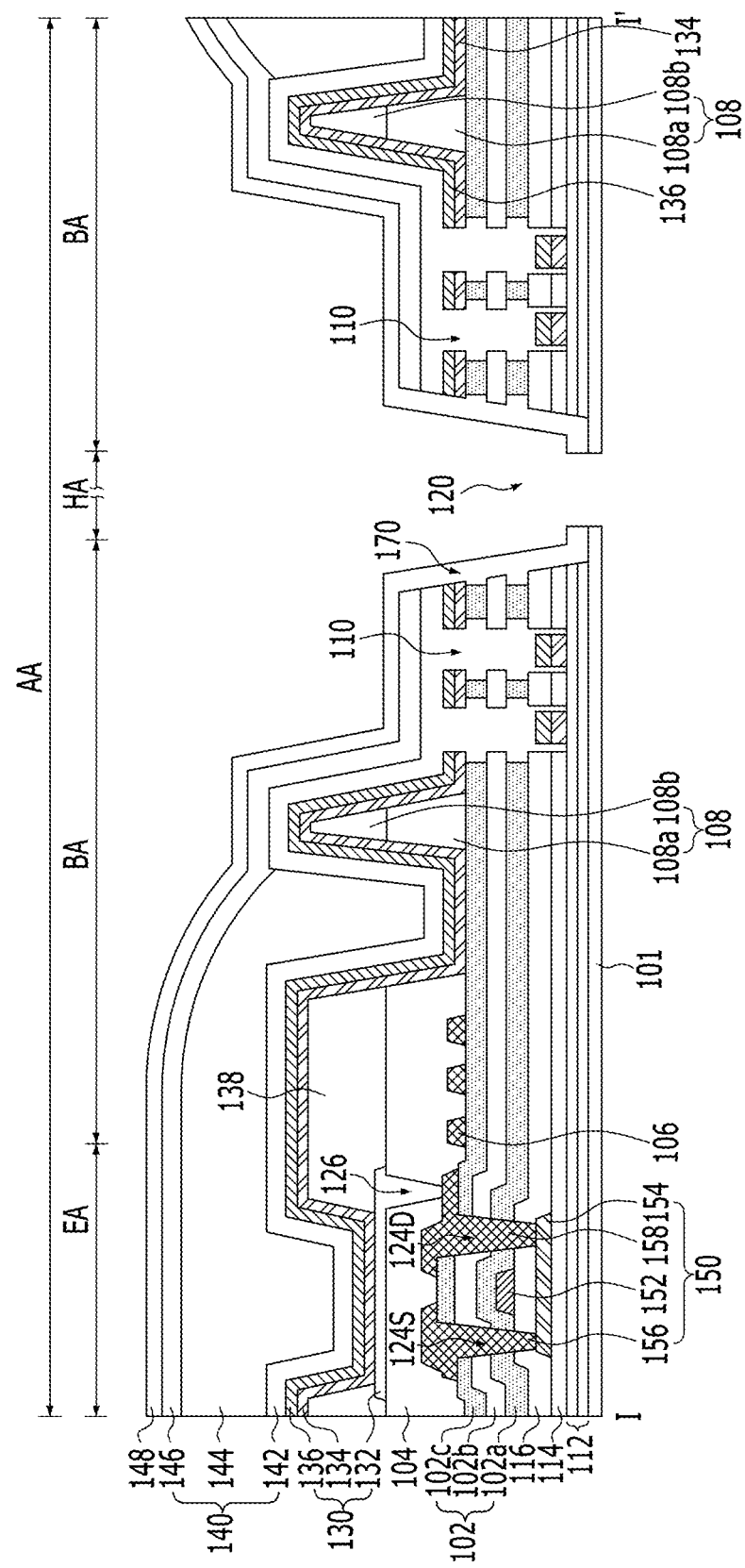
FIG. 10 is a cross-sectional view illustrating another embodiment of the through hole illustrated in FIG. 2.

Meanwhile, although the through hole 170 has been described as being formed to pass through the inorganic insulating layers 112, 114, 116 and 102, the light emitting stack 134, the cathode 136, and the inorganic encapsulation layers 142 and 146 disposed between the substrate 101 and the inorganic cover layer 148 in accordance with the present disclosure, as illustrated in FIG. 2, the through hole 170 may be formed to extend only to the first and second inorganic encapsulation layers 142 and 146 and the multi-buffer layer 112, as illustrated in FIG. 10. That is, since each blocking hole 110 is formed to pass through portions of the active buffer layer 114, the gate insulating film 116 and the interlayer insulating film 102 disposed in the hole area HA and the area disposed therearound, the through hole 170 may be formed to pass through only the first and second inorganic encapsulation layers 142 and 146 and the multi-buffer layer 112. In this case, side surfaces of the second interlayer insulating film 102b exposed through the through hole 170 protrude beyond side surfaces of the first and third interlayer insulating films 102a and 102c, or the side surfaces of the first and third interlayer insulating films 102a and 102c protrude beyond the side surfaces of the second interlayer insulating film 102b.

Since only the first and second inorganic encapsulation layers 142 and 146 and the multi-buffer layer 112 are selectively etched during formation of the through hole 170, as described above, it may be possible to simplify the process of forming the through hole 170.

As apparent from the above description, the present disclosure provides the following effects.

As the substrate hole, in which a camera module is fitted, is disposed within the active area in accordance with the present invention, it may be possible to minimize the bezel area, which is a non-display area of the display device.

In addition, in accordance with the present disclosure, side surfaces of the upper inorganic insulating film exposed through each blocking hole protrude beyond those of the lower inorganic insulating film, the light emitting stack is disconnected without having continuance in the blocking hole. Accordingly, it may be possible to prevent or delay introduction of external moisture into the emission area by the blocking hole.

It will be apparent to those skilled in the art that various modifications and variations can be made in the present invention without departing from the spirit or scope of the invention. Thus, it is intended that the present disclosure cover the modifications and variations of this invention provided they come within the scope of the appended claims and their equivalents.

What is claimed is:

1. A display device comprising:
a substrate comprising an emission area and at least one hole area disposed within an active area;
a light emitting element disposed on the substrate in the emission area;
a plurality of inorganic insulating films disposed beneath the light emitting element, the plurality of inorganic insulating films having a first inorganic insulating film, a second inorganic insulating film, and a third inorganic insulating film, wherein the first inorganic insulating film, the second inorganic insulating film, and the third inorganic insulating film are sequentially laminated; and
at least one blocking hole passing through the plurality of inorganic insulating films,
wherein a side surface of the second inorganic insulating film exposed through the blocking hole protrudes beyond a side surface of the first inorganic insulating film exposed through the blocking hole.

2. The display device according to claim 1, further comprising:
a thin film transistor connected to the light emitting element,
wherein the first inorganic insulating film, the second inorganic insulating film, and the third inorganic insulating film are sequentially laminated between each of a source electrode and a drain electrode of the thin film transistor and a gate electrode of the thin film transistor.

3. The display device according to claim 2, wherein:
the first inorganic insulating film and the third inorganic insulating films are made of $SiN_x$, and the second inorganic insulating film is made of $SiO_x$.

4. The display device according to claim 2, wherein:
the first and third inorganic insulating films are made of $SiO_x$, and
the second inorganic insulating film is made of $SiN_x$.

5. The display device according to claim 2, further comprising:
a hard mask pattern disposed on the third inorganic insulating film,
wherein the hard mask pattern is formed to have a single-layer structure or a multilayer structure, using one of ITO, MoTi, Mo, and Ti.

6. A display device, comprising:
a substrate comprising an emission area and at least one hole area disposed within an active area;
a light emitting element disposed on the substrate in the emission area;
a plurality of inorganic insulating films disposed beneath the light emitting element, the plurality of inorganic insulating films having a first inorganic insulating film, a second inorganic insulating film, and a third inorganic insulating film;
a hard mask pattern disposed on the third inorganic insulating film; and
at least one blocking hole passing through the plurality of inorganic insulating films and the hard mask pattern,
wherein a side surface of the second inorganic insulating film exposed through the blocking hole protrudes beyond a side surface of the first inorganic insulating film exposed through the blocking hole, and
wherein a side surface of the hard mask pattern exposed through the blocking hole protrudes beyond a side surface of the third inorganic insulating film.

7. The display device according to claim 2, further comprising:
a passivation film disposed between the thin film transistor and an anode of the light emitting element,
wherein the passivation film is made of a material different from a material of the second inorganic insulating film.

8. The display device according to claim 7, wherein a side surface of the passivation film exposed through the blocking hole protrudes beyond the side surface of the second inorganic insulating film.

9. The display device according to claim 1, further comprising:

a plurality of inner dams disposed between the hole area and the emission area; and a substrate hole disposed in the hole area while passing through the substrate, wherein the at least one blocking hole is disposed between the plurality of inner dams and the substrate hole.

10. The display device according to claim 1, further comprising:

a camera module disposed in the hole area.

11. The display device according to claim 1, wherein the side surface of the second inorganic insulating film protrudes beyond the side surface of the first inorganic insulating film in a bezel area disposed between the hole area and the emission area.

12. The display device according to claim 1, wherein the second inorganic insulating film forms an undercut structure together with the first inorganic insulating film.

13. A display device comprising:

a substrate comprising an emission area and at least one hole area disposed within an active area;

a light emitting element disposed on the substrate in the emission area;

a plurality of inorganic insulating films disposed beneath the light emitting element, the plurality of inorganic insulating films having a first interlayer insulating film, a second interlayer insulating film, and a third interlayer insulating film;

a hard mask pattern disposed on the third interlayer insulating film; and at least one blocking hole passing through the plurality of inorganic insulating films and the hard mask pattern wherein a side surface of the third interlayer insulating film exposed through the blocking hole protrudes beyond a side surface of the second interlayer insulating film exposed through the blocking hole, and wherein a side surface of the hard mask pattern exposed through the blocking hole protrudes beyond the side surface of the second interlayer insulating film.

14. The display device according to claim 6, wherein the hard mask pattern is formed to have a single-layer structure or a multilayer structure, using one of ITO, MoTi, Mo, and Ti.

15. The display device according to claim 13, wherein the hard mask pattern is formed to have a single-layer structure or a multilayer structure, using one of ITO, MoTi, Mo, and Ti.

* * * * *